United States Patent
Chodakowski et al.

(10) Patent No.: US 9,627,333 B1
(45) Date of Patent: Apr. 18, 2017

(54) EMERGENCY DESTRUCTION OF INTEGRATED CIRCUITS

(71) Applicant: International Business Machines Corporation, Armonk, NY (US)

(72) Inventors: Sebastian M. Chodakowski, Hursley (GB); David A. Chynoweth, Southampton (GB); Joshua E. Vines, Telford (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/082,631

(22) Filed: Mar. 28, 2016

(51) Int. Cl.
*H01L 23/58* (2006.01)
*H01L 23/00* (2006.01)
*H01L 27/02* (2006.01)
*H01L 23/02* (2006.01)

(52) U.S. Cl.
CPC .......... *H01L 23/564* (2013.01); *H01L 23/02* (2013.01); *H01L 27/0203* (2013.01)

(58) Field of Classification Search
CPC .... H01L 23/02; H01L 23/564; H01L 27/0203
See application file for complete search history.

(56) References Cited

U.S. PATENT DOCUMENTS

| | | | |
|---|---|---|---|
| 7,884,625 B2 | 2/2011 | Bartley et al. | |
| 2008/0010690 A1 | 1/2008 | Delapierre | |
| 2010/0103631 A1* | 4/2010 | Tong | G06F 21/86 361/752 |
| 2012/0068326 A1 | 3/2012 | Das et al. | |

FOREIGN PATENT DOCUMENTS

EP   2924724 A1   9/2015

OTHER PUBLICATIONS

Williams, "Xerox PARC's new chip will self destruct in 10 seconds", IDG News Service, Sep. 10, 2015. http://www.pcworld.com/article/2983015/hardware/xerox-parcs-new-chip-will-self-destruct-in-10-seconds.html 4 pages, last printed Jan. 29, 2016.

* cited by examiner

*Primary Examiner* — Daniel Shook
(74) *Attorney, Agent, or Firm* — Nicholas D. Bowman

(57) ABSTRACT

An integrated circuit has a set of circuit components. The set of circuit components enables the circuit to execute an action. The integrated circuit has a structural weakness. In response to undergoing a mechanical force, the structural weakness will cause the integrated circuit to undergo a structural failure. A human is able to provide the mechanical force without the use of tools. The structural failure will alter one or more circuit components of the set of circuit components. The alteration will result in the set of circuit components no longer enabling the integrated circuit to execute the action.

20 Claims, 4 Drawing Sheets

EMERGENCY DESTRUCTION OF INTEGRATED CIRCUITS

BACKGROUND

The present disclosure relates to computer chips, and more specifically, to the destruction of integrated circuits (ICs).

Computer chips, such as ICs, are increasingly prevalent in modern commercial products. Computer chips may be in such products as radio frequency identification (RFID) entrance badges, solid state drives (SSDs), or flash drives. Computer chips are often designed and manufactured to be as small as possible for space considerations.

SUMMARY

According to embodiments of the present disclosure an apparatus and method of manufacture of an integrated circuit (IC) that a human may destroy without tools is provided. The IC may have a set of circuit components. The set of circuit components enables the circuit to execute an action. The IC is configured to have a structural weakness which enables a human to provide sufficient mechanical force without tools to cause the IC to undergo a structural failure. The structural failure will alter one or more circuit components of the set of circuit components. The alteration will result in the set of circuit components no longer enabling the IC to execute the action.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
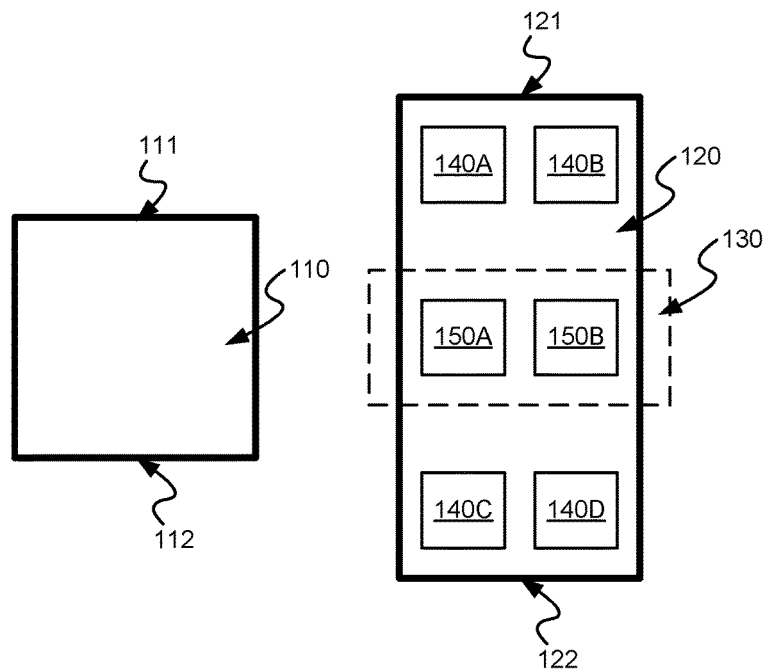
FIG. 1A depicts a conventional integrated circuit and a humanly destructible integrated circuit, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to integrated circuits that humans are able to destroy without the use of tools. The integrated circuit executes operations using components of the integrated circuit, such as a power source or logic gates. The integrated circuit is configured to have a structural weakness enabling a human to cause a failure of the structural weakness without the use of tools. For example, the structural weakness may be a function of a relatively increased length of the integrated circuit. The integrated circuit can be broken if a sufficient mechanical force is exerted upon the structural weakness. Once the integrated circuit (or one or more components of the integrated circuit) is broken, the integrated circuit can no longer execute one or more operations. While the present disclosure is not necessarily limited to such applications, various aspects of the disclosure may be appreciated through a discussion of various examples using this context.

In instances, chip developers are attempting to make conventional integrated circuits increasingly small. Conventional integrated circuits often take up no more area than the size of a fingernail. As such, when a user of a conventional integrated circuit has a need to destroy or otherwise damage a conventional integrated circuit, the user often requires the use of a tool. For example, a user may use a battering tool (e.g., a hammer), a tool that emits electricity, a tool that scrambles software or firmware, a tool that emits radiation, a tool that emits radio signals, chemicals, or other such tools to destroy the integrated circuit. In situations where such a tool is not available, it may be difficult or impossible to destroy or otherwise damage the integrated circuit.

Aspects of the disclosure relate to an integrated circuit that a human can destroy or otherwise damage without the use of tools. For example, a human, using only their hands, may damage the integrated circuit by bending or twisting the integrated circuit. The integrated circuit may be damaged by a human as a result of a structural weakness intentionally designed into the integrated circuit. For example, the integrated circuit may be made 50-100% longer in one dimension relative to another dimension (e.g., a one inch by one inch integrated circuit may be altered to a one inch by two inch integrated circuit). As a result of the increased length, a human may be able to, for example, snap the integrated circuit into two pieces using their hands. The structural weakness could alternatively include a portion of the integrated circuit that is made from a relatively weaker material, resulting in the integrated circuit being easier to break when mechanical force is applied in such a way that the weaker portion is targeted. Additionally, the structural weakness may include a "bridge" wherein the integrated circuit is thinned across one or more dimensions for a portion of the integrated circuit. For example, a two-centimeter long integrated circuit that is (at its widest) 1.75 centimeters wide and (at its tallest) 0.65 millimeters tall may have a 0.25 centimeter long "bridge" in the middle of the integrated circuit. Upon this bridge, the integrated circuit may shrink to 0.75 centimeters wide and 0.30 millimeters tall. Across this bridge the integrated circuit may be more susceptible to a structural failure (e.g., breaking) due to a mechanical force. As a result of the susceptibility of this bridge, a human may cause a structural failure on the integrated circuit using only their hands by twisting or bending the integrated circuit.

The integrated circuit may perform a function. For example, the integrated circuit may include radio frequency identification (RFID) components and may be part of a security badge that opens doors, or the integrated circuit may be part of a flash drive or solid state drive (SSD) with sensitive data. After a structural failure, the integrated circuit may no longer be able to perform the function. In some embodiments, after the structural failure, the integrated circuit may not be able to be repaired to a state in which the integrated circuit can again perform the function.

In some embodiments the integrated circuit may have a safety feature. The safety feature is a physical part that can strengthen the structural weakness such that a human can no longer cause structural failure of the integrated circuit without the use of tools for as long as the safety feature is in the "safe" position. The safety feature may be any variety of a physical part that can strengthen a structural weakness as understood by one skilled in the art. For example, the safety feature may include a button or switch that can be held down to expose the structural weakness, similar to the locking switch used to remove a battery from a laptop. Alternatively, a safety feature could include a multi-part housing for an integrated circuit, wherein the housing could be split apart. In this way a safety feature could be similar to a USB that includes a lid for the metal connector, in fact such a USB that includes an integrated circuit could be furthered opened to expose the delicate circuitry of the integrated circuit.

Referring to FIG. 1A, a conventional integrated circuit (IC) 110 and a humanly-destructible IC 120 as described herein are depicted. In some embodiments, the conventional IC 110 and the humanly-destructible IC 120 may perform the same function. For example, the conventional IC 110 and the humanly-destructible IC 120 may both perform RFID-related functions. The visual arrangement of components in FIG. 1A is not to be construed as limiting the possible shape or configuration of humanly-destructible ICs 120, as certain humanly-destructible ICs 120 may be shaped differently or have components located in different positions while still being a humanly-destructible IC 120 as described herein and understood by one skilled in the art.

A conventional IC 110 may be difficult or impossible for humans to destroy without the use of tools. In comparison, the humanly-destructible IC 120 is configured to have a structural weakness 130 that can be exploited by a human to cause the structural failure (e.g., destruction or otherwise impairment) of the destructible IC 120. In this example, the humanly-destructible IC 120 may have a structural weakness 130 as a result of an increased length. For example, the humanly-destructible IC 120 may be 50-100% longer in a single direction than a respective conventional IC 110 in order to have a structural weakness 130.

The structural weakness 130 in this embodiment is a propensity to being twisted or bent. For example, if a human pressed down with a thumb both at a top edge 121 and a bottom edge 122 of the humanly-destructible IC 120 with a moderate amount of force (e.g., an amount of force that the 90% of healthy adult humans could provide in such a manner), the relatively increased length (compared to a conventional IC 110) may cause a structural failure on the humanly-destructible IC 120 located within the structural weakness 130. Conversely, if a human pressed down on the top edge 111 and bottom edge 112 of a conventional IC 110 with the same amount of force, the conventional IC 110 may be unharmed. The conventional IC 110 may be unharmed as a result of the lack of a relatively increased length, which therein results in a lack of a structural weakness 130.

The amount of force required to damage or destroy the humanly-destructible IC 120 may be such that the humanly-destructible IC 120 would not be accidentally damaged or destroyed. For example, if an IC undergoes "x" amount of mechanical force as a result of typical daily use, and a normal human is typically able to provide "10x" amount of mechanical force (e.g., ten times as much force as an IC would undergo as a result of typical daily use), then the humanly-destructible IC 120 may require "7x" amount of mechanical force (e.g., seven times as much force as an IC would undergo as a result of typical daily use) in order to cause the structural failure. Of course, a multitude of mechanical forces may be required/considered in different embodiments depending upon the specific materials, configurations, and safety factors of the humanly-destructible IC 120, as understood by one skilled in the art. For example, if the humanly-destructible IC 120 contains extremely secure information that a human may want to destroy at a moment's notice, a structural failure of said humanly-destructible IC 120 may occur at "2x" amount mechanical force as used above. Conversely, for a relatively mundane humanly-destructible IC 120 that contains no sensitive data but rather is destroyed following use as a matter of protocol, a structural failure may require a full "10x" amount of mechanical force.

The humanly-destructible IC 120 includes one or more circuit components 140, 150. The humanly-destructible IC 120 includes critical components 150 that are required to execute actions. For example, critical component 150A may be a primary power source and critical component 150B may be a primary memory cell. Additionally, the humanly-destructible IC 120 may include ancillary components 140 that may be destroyed or impaired while still allowing the humanly-destructible IC 120 to execute primary actions. For example, ancillary components 140A, 140B, and 140C may include backup logic while ancillary component 140D is a backup power source.

As shown in FIG. 1A, the critical components 150 are located in the structural weakness 130 location of the humanly-destructible IC 120. Accordingly, when the humanly-destructible IC 120 is destroyed or damaged as a result of the mechanical force imparted by a human, the critical components 150 are themselves altered (e.g., destroyed or damaged). For example, a critical component could be uncoupled, crushed, or broken into numerous pieces as a result of the structural failure. In some embodiments, once altered the critical components may not be repaired to a point where the humanly-destructible IC 120 may once again execute its original action.

For example, the humanly-destructible IC 120 may be a microchip for an RFID tag that is itself part of a security "passcard" that can be used to enter secure doors/rooms/buildings. The critical components 150 of the humanly-destructible IC 120 may be located within the structural weakness 130, and may include memory cells storing critical memory, such as a frequency to transmit. A human may press down with moderate force on the two ends 121, 122 of the humanly-destructible IC 120, therein causing structural failure to the humanly-destructible IC 120 along the structural weakness 130. This damage or destruction may itself alter the critical components 150. As a result of this alteration, the microchip may be irreparably damaged such that the passcard cannot be repaired to a point where the passcard could again be used to enter secure doors/rooms/buildings.

Figure 1B:
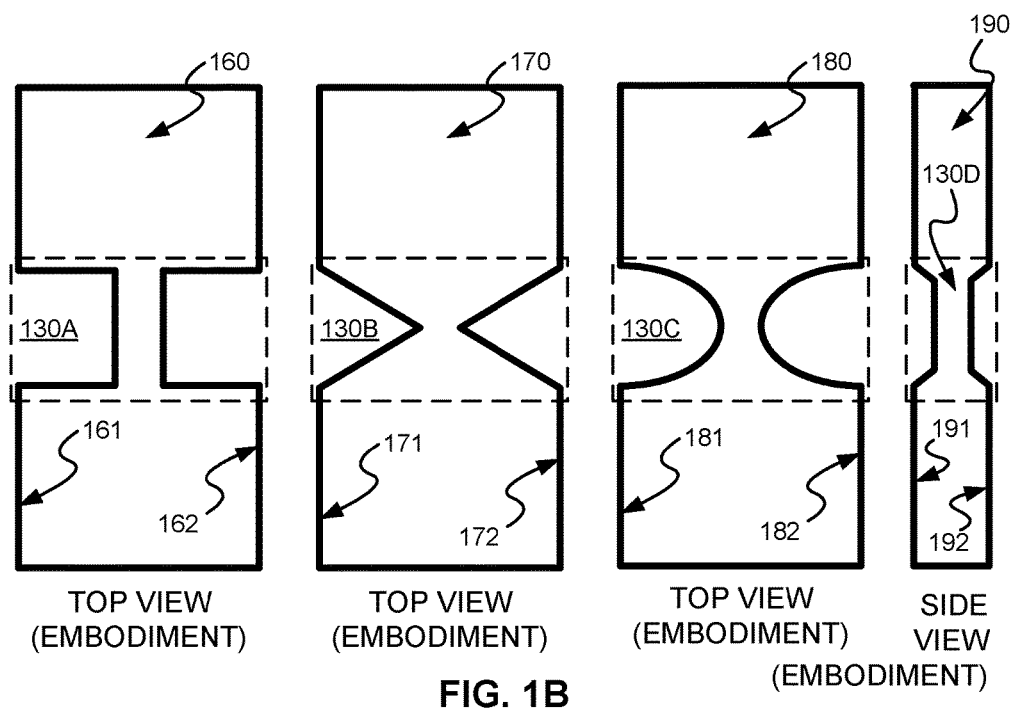
FIG. 1B depicts three example top views and an example side view of integrated circuits configured to have structural weaknesses, according to embodiments.

FIG. 1B depicts different views of embodiments of example structural weaknesses 130 of humanly-destructible ICs. Specifically, FIG. 1B depicts humanly-destructible ICs that include a bridge as a structural weakness 130. A bridge utilizes "cutouts" of an IC wherein physical material of the humanly-destructible IC is reduced/removed in at least one dimension. A cutout is a space or void left after removing a piece of material from a thing, in this case a portion of the humanly-destructible IC. The size and specific shapes of the cutouts within FIG. 1B are singular examples for purposes of illustration and clarity; it is to be understood that larger or smaller cutouts of different angles or shapes are within the scope of this disclosure. The humanly-destructible ICs of FIG. 1B are consistent with the humanly-destructible ICs described above in regards to FIG. 1A.

As used herein, the "top" of the humanly-destructible IC is the surface of the humanly-destructible IC that contains the most surface area. Generally speaking, the top of the humanly-destructible IC also contains the majority of circuit components (e.g., memory, power sources, logic gates, etc.). However, as "top" is used herein, an inverse side that contains the same amount of surface area and does not contain the majority of circuit components (e.g., the bottom of the IC) is generally equivalent to the top surface for purposes of FIG. 1B. Additionally, as used herein, the "side" of the humanly-destructible IC is the surface with the third or fourth most surface area, granted that the humanly-destructible IC is generally the shape of a rectangular solid. For example, looking at humanly-destructible IC 160, the side would be the surface visible if surface 162 were rotated either into or out of the page 90 degrees along the long axis of humanly-destructible IC 160.

The top view of a first humanly-destructible IC 160 depicts a bridge 130A with square cutouts from both a left side 161 and right side 162 of the humanly-destructible IC 160. A humanly-destructible IC 160 with a bridge 130A with square cutouts may be relatively easy to manufacture, compared to other varieties of cutouts. The top view of a second humanly-destructible IC 170 depicts a bridge 130B with triangle cutouts from both a left side 171 and right side 172 of the humanly-destructible IC 170. A humanly-destructible IC 170 with a bridge 130B with triangular cutouts may be relatively easy to damage or destroy as a result of mechanical force (e.g., less mechanical force may be required to damage or destroy such a humanly-destructible IC 170). The top view of a third humanly-destructible IC 180 depicts a bridge 130C with oval cutouts from both a left side 181 and right side 182 of the humanly-destructible IC 190. The side view of another humanly-destructible IC 190 depicts a bridge 130D with trapezoidal cutouts from both a bottom side 191 and top side 192 of the humanly-destructible IC 190.

In some embodiments, a humanly-destructible IC may have a bridge in numerous dimensions, meaning that a humanly-destructible IC may have cutouts from both a top view and from a side view. For example the humanly-destructible IC 120 of FIG. 1A could have a bridge using square cutouts 130A on the top as well as trapezoidal cutouts from the side 130D.

In some embodiments, a bridge will contain circuit components. Bridges of humanly-destructible ICs should not impair the functionality of said humanly-destructible ICs before a destructive mechanical force is applied by a human. Put differently, a humanly-destructible IC should perform substantially similarly to a conventional IC prior to structural failure regardless of whether or not said humanly-destructible IC has a bridge.

While FIG. 1B depicts symmetrical bridges with two cutouts from either side of a humanly-destructible IC, in some embodiments a bridge may include a single cutout from a single side of a humanly-destructible IC. For example, rather than one triangle cutout from side 171 and another triangle cutout from side 172 on humanly-destructible IC 170, in some embodiments the humanly-destructible IC 170 may include a single triangle cutout from side 171. The single cutout could be of any reasonable size or shape and on be located on either side of the IC, so long as the functionality and performance of the humanly-destructible IC 170 is not impacted.

Figure 2A:
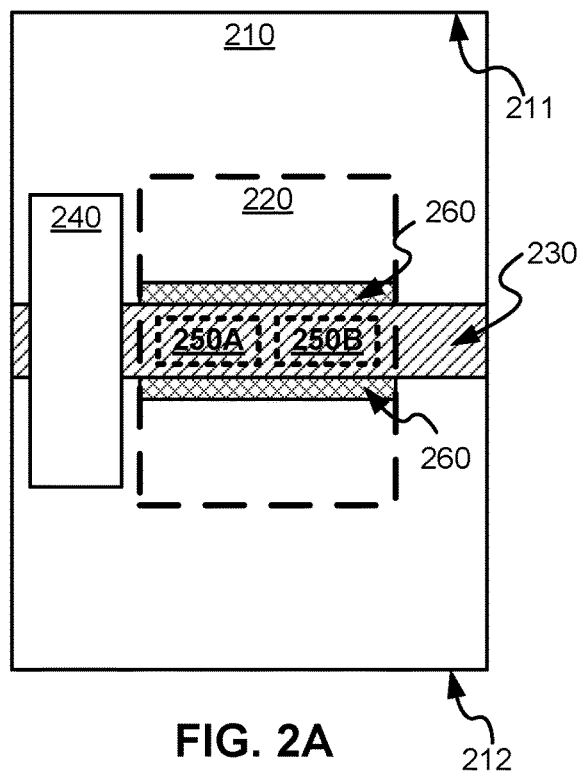
FIG. 2A depicts a host device with an integrated circuit with a safety feature in which the safety feature is engaged, according to embodiments.

FIG. 2A depicts a host device 210 that contains a humanly-destructible IC 220 that executes a function. For example, the host device 210 may be a flash drive and the humanly-destructible IC 220 may be a memory component of the flash drive. The humanly-destructible IC 220 is similar to the humanly-destructible IC 120 of FIG. 1A. The humanly-destructible IC 220 includes two components 250A, 250B that are required for the humanly-destructible IC 220 to execute its function within the host device 210. As depicted in FIG. 2A by dashed lines, the humanly-destructible IC 220 is located within the housing of the host device 210. Accordingly, the components 250 of the humanly-destructible IC 220 are also inside the host device 210. In other embodiments, the humanly-destructible IC 220 and/or its components 250 may be on the surface of the host device 210.

The humanly-destructible IC 220 has a structural weakness 260 at which the humanly-destructible IC 220 can be broken by a human without the use of tools. Similarly, the host device 210 has a structural weakness 230 which a human may exploit to break without the use of tools. The structural weakness 230 of the host device is similar to the structural weakness of a humanly-destructible IC as described herein. The structural weakness 260 of the humanly-destructible IC 220 overlaps with the structural weakness 230 of the host device 210.

In some embodiments the host device 210 will include a safety feature 240 on the housing of the host device 210. As depicted in FIG. 2A, the safety feature 240 is a moveable physical part upon this housing. The safety feature 240 may be moved to a configuration where the safety feature 240 will strengthen the structural weakness of the host device 210 and/or the humanly-destructible IC 220. As a result of being moved to such a configuration, the structural weakness 230 of the host device 210 will not break in response to a mechanical force as can be exerted upon the host device 210 without the use of tools. For example, the host device 210 may be made of a relatively weak plastic while the safety feature 240 may be a piece of carbon fiber (or some other strong material with a high tensile strength). The safety feature 240 may be in a slot of the housing of the host device. This slot may allow the safety feature to be moved to a position in which the safety feature 240 covers one or both structural weaknesses 230, 260. When moved into this "safe" position on the housing, the safety feature 240 will effectively eliminate the structural weakness 230 of the host device 210 (and therein the structural weakness 260 of the humanly-destructible IC 220) such that a human pressing on the top edge 211 and bottom edge 212 of the host device 210 with a reasonable amount of mechanical force will not be able to break the host device 210 and/or the humanly-destructible IC 220.

Figure 2B:
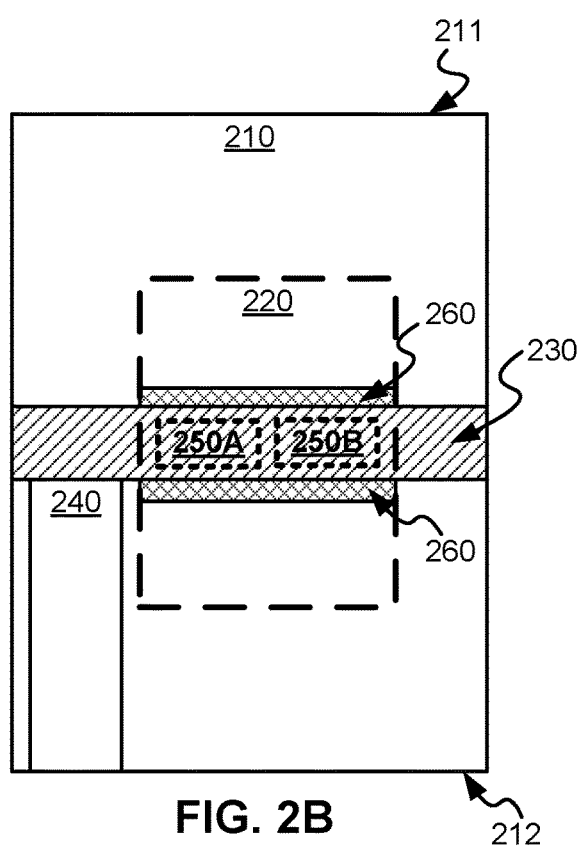
FIG. 2B depicts a host device with an integrated circuit with a safety feature in which the safety feature has been moved so that the safety feature is not engaged, according to embodiments.

In order to cause structural failures of the host device 210 or humanly-destructible IC 220, the safety feature will need to be moved to a location upon the housing in which the structural weaknesses 230, 260 are not reinforced. FIG. 2B depicts an embodiment of the same humanly-destructible IC 220 within a host device 210 as depicted in FIG. 2A.

However, in FIG. 2B, the safety feature 240 has been moved to a location of the host device 210 housing where the safety feature 240 is not reinforcing the structural weakness 230 of the host device 210 or the structural weakness 260 of the humanly-destructible IC 220. In this position, if a human presses down on the top edge 211 and the bottom edge 212 of the host device 210 as described herein, both the host device 210 and the humanly-destructible IC 220 would undergo a structural failure along their overlapping structural weaknesses 230, 260. As a result of the structural failure, the critical components 250 of the humanly-destructible IC 220 will also be altered such that the humanly-destructible IC 220 and/or the host device 210 will no longer function properly. For example, where the host device 210 is a flash drive and the humanly-destructible IC 220 is a memory component of the flash drive, data of the flash drive may be corrupted or otherwise irretrievable.

Figure 2C:
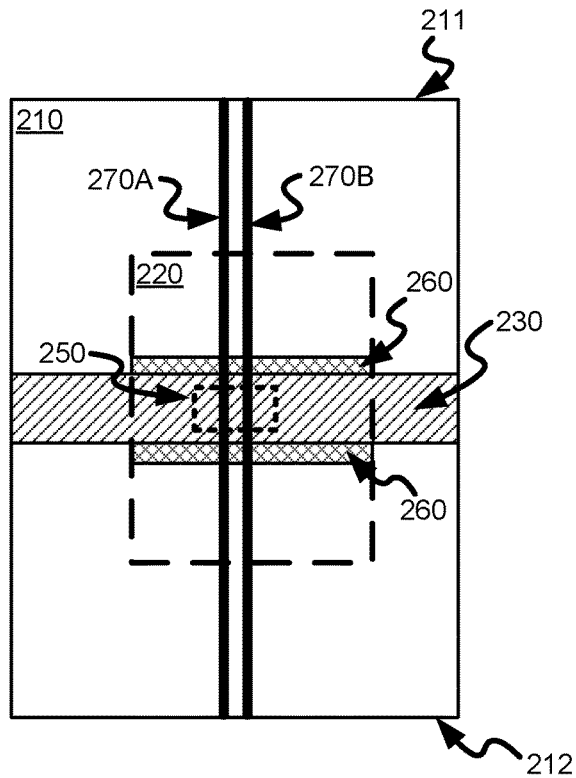
FIG. 2C depicts a host device with an integrated circuit with rods, according to embodiments.

In some embodiments, the host device 210 may be configured to incorporate other elements to assist in the impairment of the humanly-destructible IC 220 in response to the mechanical force of a human. FIG. 2C depicts a host device 210 that is configured to include rods 270 to assist in the impairment of the humanly-destructible IC 220. The rods 270 are located within the housing of the host device 210 such that the rods 270 overlap the humanly-destructible IC 220 within the structural weakness 230 of the host device 210 and/or the structural weakness 260 of the humanly-destructible IC 220. In some embodiments, the host device 210 may configure the rods 270 such that the rods overlap one or more critical components 250 of the humanly-destructible IC 220.

The rods 270 may include two rods 270A, 270B. One rod 270A may be located above the humanly-destructible IC 220 within the housing of the host device 210 while the other rod 270B is located below the humanly-destructible IC 220 within the housing of the host device 210, such that the IC 220 is between the two rods 270A, 270B. While the rods are depicted within FIG. 2C as not being in the same vertical plane (e.g., not being directly on top of each other) for purposes of clarity, in some embodiments the rods may be configured within the same vertical plane (e.g., rod 270A being located directly over rod 270B as seen from a top view, with the humanly-destructible IC 220 being between rod 270A and rod 270B).

When a human presses upon a top 211 and bottom 212 edge of the housing of a host device 210, the rods 270 may act upon the humanly-destructible IC 220 to provide a further destructive force using the mechanical force provided by the human. In some embodiments, the two rods 270A, 270B may be thinned and sharpened to provide a scissoring effect to cut the critical components 250 between the rods 270A, 270B. In other embodiments, the two rods 270A, 270B may be blunt and made from a very strong material (e.g., strong relative to the humanly-destructible IC 220 and/or the housing of the host device 210) to crush the critical components 250 between the rods 270A, 270B. In certain embodiments, the housing of the host device 210 may incorporate more than two rods 270 to bolster the impairment resulting from the mechanical force of a human.

Figure 2D:
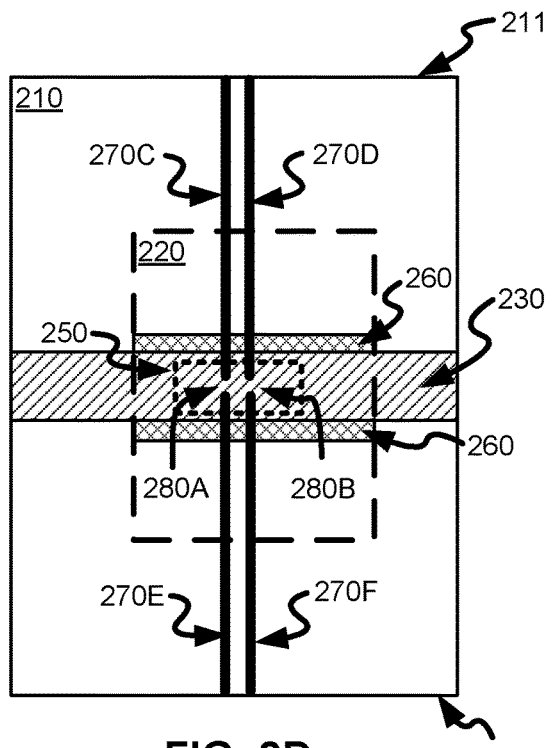
FIG. 2D depicts a host device with an integrated circuit with rods that have a gap, according to embodiments.

As depicted in FIG. 2D, in certain embodiments the rods 270C-F of the host device 210 may be configured with a gap 280A-B. This gap 280 may be the result of the rods 270 being cut in half. For example, where rod 270A was an intact rod from the top edge 211 to the bottom edge 212 of the host device 210, FIG. 2D depicts two separate rods 270C, 270E that extend from the top edge 211 and bottom edge 212 of the host device to a gap 280A within the host device 210, respectively.

The gap 280 may include a physical location over a humanly-destructible IC 220 between a first rod 270 and a second rod 270, such that neither rod 270 physically traverses the humanly-destructible IC 220 from one side to another. In some embodiments, the gap 280 may include a physical space between two rods as depicted in FIG. 2D. In other embodiments, the gap 280 may include a place where two separate rods 270 physically touch but are not otherwise attached or coupled (e.g., the two separate rods 270 are not glued together, soldered together, etc.). The host device 210 may be configured such that the gap 280 is located within the structural weakness 230 of the housing of the host device 210 and/or the structural weakness 260 of the humanly-destructible IC 220. The host device 210 may be further configured such that the gap 280 is located over one or more critical component 250 of the humanly-destructible IC 220. A host device that is configured with a set of rods 270 with a gap 280 may utilize the rods as respective levers to amplify the mechanical force applied by a human.

Figure 3:
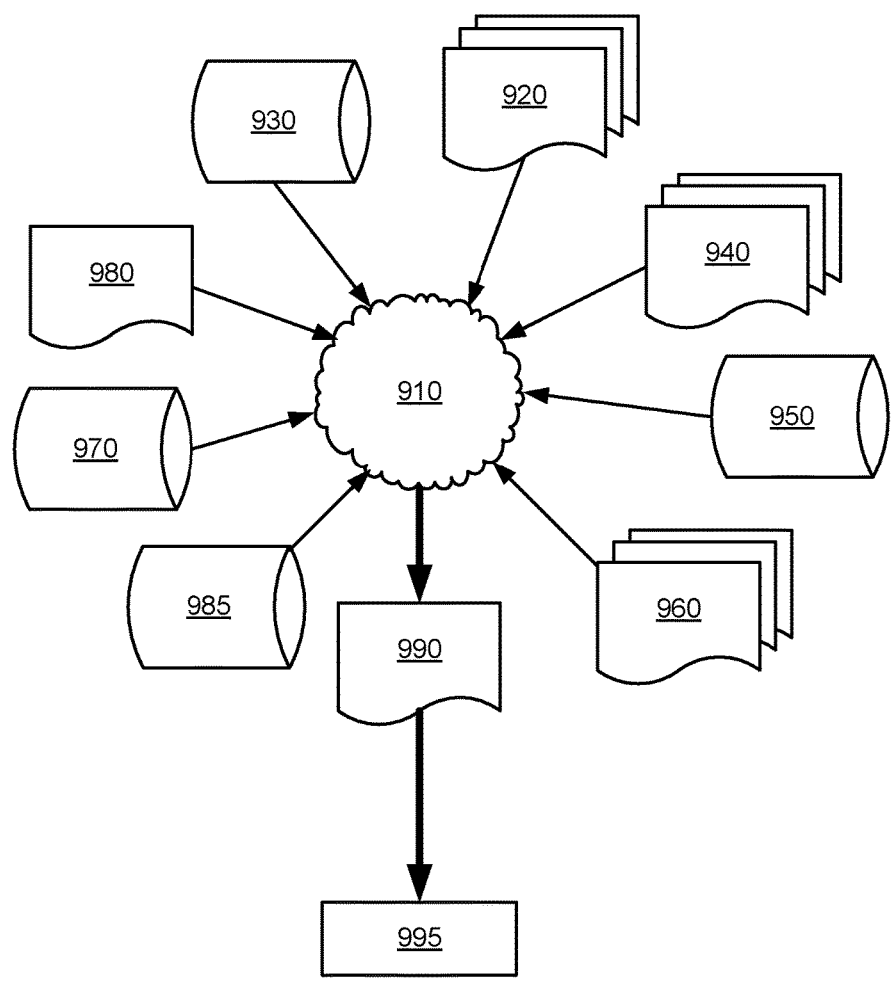
FIG. 3 depicts a flow diagram of a design process used in circuit design, according to embodiments.

FIG. 3 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1A, FIG. 1B, FIG. 2A, and FIG. 2B. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1A, FIG. 1B, FIG. 2A, and FIG. 2B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1A, FIG. 1B, FIG. 2A, and FIG. 2B to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an IC design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1A, FIG. 1B, FIG. 2A, and FIG. 2B. In one embodiment, design structure 990 may comprise a compiled, executable HDL simulation model that functionally simulates the devices shown in FIG. 1A, FIG. 1B, FIG. 2A, and FIG. 2B.

Design structure 990 may also employ a data format used for the exchange of layout data of ICs and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1A, FIG. 1B, FIG. 2A, and FIG. 2B. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An integrated circuit (IC) comprising:
    a set of circuit components that enables the IC to execute an action; and
    an element of structural weakness configured to cause the IC to undergo a structural failure which alters one or more circuit components of the set of circuit components such that the set of circuit components will no longer enable the IC to execute the action following the structural failure, wherein the element of structural weakness is configured to cause the IC to undergo the structural failure in response to an application of a mechanical force to the element of structural weakness that exceeds a mechanical force threshold, the element of structural weakness being configured such that a human is able to provide the mechanical force that exceeds the mechanical force threshold without the use of tools.

2. The IC of claim 1, wherein the element of structural weakness is a length to thickness ratio of the IC, the mechanical force threshold being a function of the length to thickness threshold.

3. The IC of claim 1, further comprising a safety feature that can be moved from a first position upon the IC to a second position upon the IC, wherein:
when the safety feature is in the first position, the safety feature strengthens the element of structural weakness and when the safety feature is in the second position, the safety feature does not strengthen the element of structural weakness.

4. The IC of claim 1, wherein the element of structural weakness is a bridge, wherein the bridge includes one or more cutouts.

5. The IC of claim 4, wherein the one or more cutouts are rectangular in shape.

6. The IC of claim 4, wherein the one or more cutouts are triangular in shape.

7. The IC of claim 1, wherein, following the alteration of the one or more circuit components, the IC cannot be repaired to a state in which the IC will execute the action.

8. A host device comprising:
a housing; and
an integrated circuit (IC), the integrated circuit comprising:
a set of circuit components on the IC that enables the host device to execute an action; and
a first element of structural weakness of the IC configured to cause the IC to undergo a structural failure that alters one or more circuit components of the set of circuit components such that the set of circuit components will no longer enable the host device to execute the action following the structural failure, wherein the first element of structural weakness is configured to cause the IC to undergo the structural failure in response to an application of a mechanical force to the first element of structural weakness that exceeds a first mechanical force threshold, the first element of structural weakness being configured such that a human is able to provide the mechanical force that exceeds the first mechanical force threshold without the use of tools.

9. The host device of claim 8, wherein:
the host device has a second element of structural weakness; and
the second element of structural weakness is configured to cause the host device to undergo a structural failure in response to application of the mechanical force exceeding a second mechanical force threshold, the second element of structural weakness being configured such that a human is able to provide the mechanical force that exceeds the second mechanical force threshold without the use of tools.

10. The host device of claim 9, wherein the second element of structural weakness is a length to thickness ratio of the host device, the second mechanical force threshold being a function of the length to thickness threshold.

11. The host device of claim 8, wherein the first element of structural weakness is a length to thickness ratio of the IC, the first mechanical force threshold being a function of the length to thickness threshold.

12. The host device of claim 8, further comprising a safety feature that can be moved from a first position upon the housing to a second position upon the housing, wherein:
when the safety feature is in the first position, the safety feature strengthens the first element of structural weakness and when the safety feature is in the second position, the safety feature does not strengthen the first element of structural weakness.

13. The host device of claim 8, wherein, following the alteration of the one or more circuit components, the host device cannot be repaired to a state in which the host device will execute the action.

14. A design structure readable by a machine used in design, manufacture, or simulation of an integrated circuit (IC), the design structure comprising:
a set of circuit components that enables the IC to execute an action; and
an element of structural weakness configured to cause the IC to undergo a structural failure which alters one or more circuit components of the set of circuit components such that the set of circuit components will no longer enable the IC to execute the action following the structural failure, wherein the element of structural weakness is configured to cause the IC to undergo the structural failure in response to an application of a mechanical force to the element of structural weakness that exceeds a mechanical force threshold, the element of structural weakness being configured such that a human is able to provide the mechanical force that exceeds the mechanical force threshold without the use of tools.

15. The design structure of claim 14, wherein the element of structural weakness is a length to thickness ratio of the IC, the mechanical force threshold being a function of the length to thickness threshold.

16. The design structure of claim 14, further comprising a safety feature that can be moved from a first position upon the IC to a second position upon the IC, wherein:
when the safety feature is in the first position, the safety feature strengthens the element of structural weakness and when the safety feature is in the second position, the safety feature does not strengthen the element of structural weakness.

17. The design structure of claim 14, wherein the element of structural weakness is a bridge, wherein the bridge includes one or more cutouts.

18. The design structure of claim 17, wherein the one or more cutouts are rectangular in shape.

19. The design structure of claim 17, wherein the one or more cutouts are triangular in shape.

20. The design structure of claim 14, wherein, following the alteration of the one or more circuit components, the IC cannot be repaired to a state in which the IC will execute the action.

* * * * *